United States Patent [19]
Jin

[11] Patent Number: 6,114,892
[45] Date of Patent: Sep. 5, 2000

[54] LOW POWER SCAN TEST CELL AND METHOD FOR MAKING THE SAME

[75] Inventor: London Jin, San Jose, Calif.

[73] Assignee: Adaptec, Inc., Milpitas, Calif.

[21] Appl. No.: 09/144,485

[22] Filed: Aug. 31, 1998

[51] Int. Cl.[7] ................................. G01R 31/28
[52] U.S. Cl. .......................... 327/202; 714/726
[58] Field of Search .................... 327/213, 218, 327/202, 203, 200, 201, 208; 714/726

[56] References Cited

U.S. PATENT DOCUMENTS

| | | | |
|---|---|---|---|
| 5,719,878 | 2/1998 | Yu et al. | 714/726 |
| 6,014,762 | 2/1998 | Sanghani et al. | 714/718 |

*Primary Examiner*—Tuan T. Lam
*Attorney, Agent, or Firm*—Martine Penilla & Kim, LLP

[57] ABSTRACT

Disclosed is a low power scan flop cell design for enabling low power scan mode testing and reduced heat dissipation. The low power scan flop therefore enables "at speed" testing in scan mode, which enables comprehensive testing of high speed timing faults. The scan flop cell embodies a scan cell that has inputs that include a data input pin, a scan input (SI) pin, a scan enable (SE) input, and a clock input. The scan cell has outputs that include a Q' output and an NQ' output. The scan flop cell further includes a first logic gate having a Q output, a first input pin that is connected to the Q' output of the scan cell, and a second input pin. The scan flop also includes a second logic gate having an NQ output, a first input pin that is connected to the NQ' output of the scan cell, and a second input pin. An electrical interconnection is formed between the scan enable input of the scan cell and the second input pin of both the first logic gate and the second logic gate. A scan output (SO) pin is then connected to the Q' output that is coupled to the first input pin of the first logic gate. A scan chain including a plurality of scan flop cells can therefore be constructed, wherein the scan output (SO) of one scan flop cell leads to the scan input (SI) of the next cell. This construction therefore keeps both the Q output and the NQ output completely quite during scan mode testing, which prevents the switching of logic not in the scan chain.

25 Claims, 3 Drawing Sheets

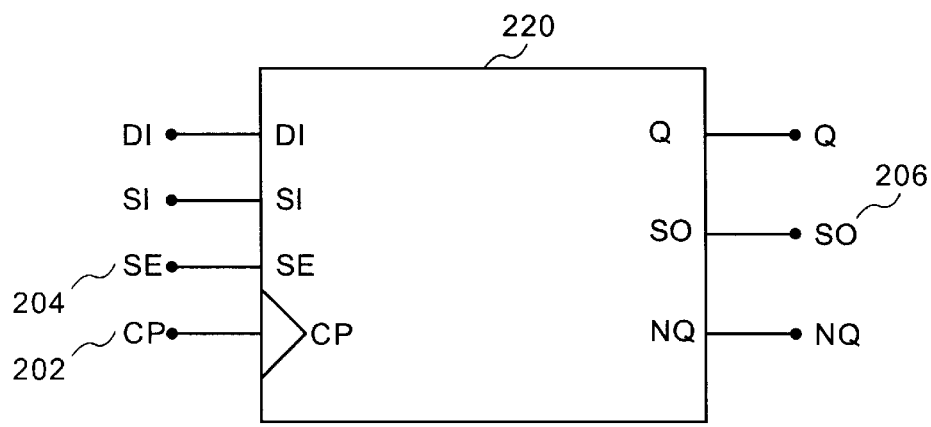
FIG. 5
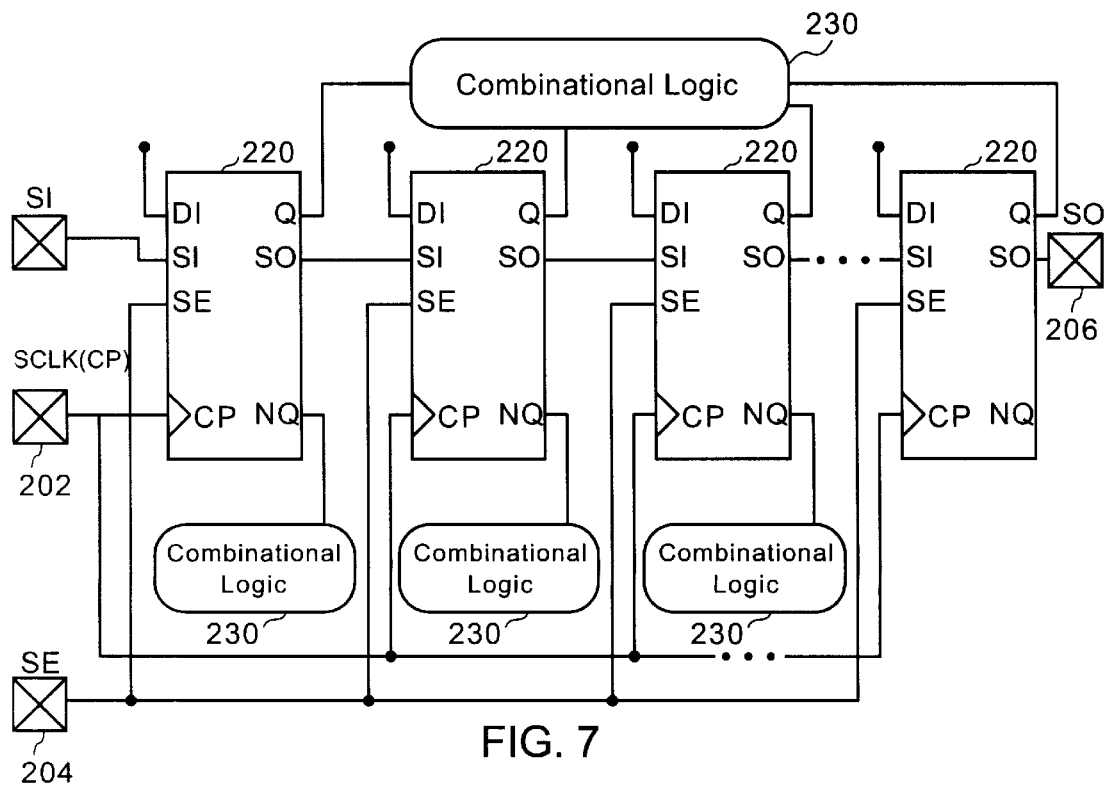
FIG. 6
FIG. 7

LOW POWER SCAN TEST CELL AND METHOD FOR MAKING THE SAME

BACKGROUND OF THE INVENTION

1. Field of the Invention

This invention relates generally to integrated circuits (ICs) and more particularly concerns low power consuming scan cells that can be used to perform at-speed testing in scan mode testing with reduced heat dissipation.

2. Description of the Related Art

In an effort to remain competitive in the marketplace, chip manufacturers are constantly striving to optimize the design and efficiency of their ICs by increasing chip speed, quality and the density of internal circuit components. Commensurate with meeting these objectives is to maximize fault coverage when testing their IC designs. A common industry design practice is to make the IC design scannable by implementing scan cells. Among many types of scan cells, the most common one is the so called "muxed-scan," or also referred to herein as a "scan flop." FIG. 1A illustrates a conventional scan flop 100 having a multiplexer 102 and a D flip flop 104. Generally, the scan flop 100 has a system data input (DI) and a scan data input (SI) that are respectively connected to the multiplexer 102. The muliplexer 102 is configured to receive a scan enable (SE) and output a signal to a D input of the D flip-flop 104. The scan flop 100 also receives a clock signal (CP) which is communicated to the D flip-flop 104, and output pins Q and NQ that are also selectively output from the D flip-flop 104. The scan flop is therefore configured to operate in one of two modes. The first mode is a "system" mode (also known as the functional mode), and the second mode is a "scan" mode (also known as the test mode).

FIG. 1B illustrates a simplified semiconductor chip 101 having a scan chain that is made up of a plurality of interconnected scan flops 100. In actuality, when a full-scan design is implemented for a semiconductor chip 101, many more scan chains are integrated into the IC design to enable the scan test to achieve the highest fault coverage. However, for this simplified example, the first scan flop 100 of the scan chain has its scan data input (SI) connected to a pad 100, and a pad 112 connected to the output pin Q of the last scan flop 100. Also shown is a clock (CLK) pad connected to each of the clock signals (CP) of the individual scan flops 100. The output pins Q of each of the scan flops 100 of the scan chain are shown connected to the scan data inputs (SI). In this common scan chain design, non-scan chain logic 106 is also connected to the output pins Q and the scan data inputs (SI).

Additionally, non-scan chain logic 106 may further be connected to the output pins NQ. When the scan flop 100 is in the system mode, the scan enable (SE) signal is constrained to ground, such that the scan flop 100 operates identically to the D-flip-flop 104. In the scan mode, the scan enable (SE) signal is active high in shifting. In general, the test vector is scanned into each one of the scan flops 100 one clock at a time. Therefore, if a particular scan chain has 1000 scan flops 100, the scan chain would take 1000 clock shifting cycles to load. Unfortunately, for the test vector to be passed to and stored into each of the scan flops 100 of the scan chain, the non-scan chain logic 106 that is driven by the Q output pins and NQ output pins will necessarily be switched as well.

To illustrate this, table 1 provides two exemplary designs A and B. The illustrated non-shifting cycles are typically parallel measure cycles and parallel capture cycles, which are used to test the integrity of circuitry that is outside of the scan chain.

TABLE 1

| Design | Shifting Cycles | Non-Shifting Cycles | Total Cycles | Shifting Cycles vs. Total Cycles |
|---|---|---|---|---|
| A | 704,225 | 3,821 | 708,343 | 99.46% |
| B | 319,734 | 1,171 | 320,905 | 99.64% |

As illustrated in table 1, the shifting cycles are approximately 99% of the total clock cycles during scan testing. Because in scan testing all scan flops are toggling simultaneously, all logic driven by the scan flops 100 (e.g., the non-scan chain logic 106) is also simultaneously affected although it has nothing to do with shifting and fault detection. The switching activity in scan mode can therefore exceed that of system mode. Excessive switching, in CMOS integrated circuit designs is generally undesirable because power consumption and heat dissipation is directly proportional to switching activity. That is, the heavier the switching activity, the more power a design needs.

Although the heavier switching activity in scan mode has not received much attention in the semiconductor industry, the heavier switching activity does pose a substantial limitation during testing. This limitation is that scan mode testing can not be performed at the same clock speed as the device is designed to operate in its system mode. In a recent article describing the testing of the PowerPC 604e™ Microprocessor, the inherent limitation in scan mode testing was exemplified by the author's strong recommendation that testing be performed at frequencies of about 60 MHz. "Test Methodology for the 0.25 micron PowerPC 604e™ Microprocessor," Rajesh Raina et al., DesignCon98: On-Chip System Design Conference, pp. 427–444 (1998), this article is hereby incorporated by reference. Because the system mode operation of the PowerPC 604e™ Microprocessor is targeted to be between 250 MHz and 350 MHz, it should be readily apparent that such low frequency testing may not detect those faults that will only be discovered when the chip is operating in system mode (e.g., such as timing faults). Many times, such late discovery may result in failures that are only discovered by the end user.

In view of the foregoing, there is a need for scan cells that will enable "at speed" testing, while eliminating unnecessary switching of logic that is outside of a scan chain, which also reduces power consumption and heat dissipation. There is a further need for scan cells that achieve the foregoing, while maintaining the simplicity of standard scan flop cells.

SUMMARY OF THE INVENTION

Broadly speaking, the present invention fills these needs by providing a new and improved scan flop that maintains the simplicity of standard scan flops while eliminating unnecessary switching of logic that is outside of the scan chain. The scan flop of the present invention therefore reduces power consumption and associated heat dissipation, which therefore enables "at speed" scan testing for even the fastest system mode frequencies. It should be appreciated that the present invention can be implemented in numerous ways, including as a process, an apparatus, a system, a device, or a method. Several inventive embodiments of the present invention are described below.

In one embodiment, a low power scan flop cell design is disclosed. The scan flop cell embodies a scan cell that has inputs that include a data input pin, a scan input (SI) pin, a scan enable (SE) input, and a clock input. The scan cell has outputs that include a Q' output and an NQ' output. The scan flop cell further includes a first logic gate having a Q output, a first input pin that is connected to the Q' output of the scan cell, and a second input pin. The scan flop also includes a second logic gate having an NQ output, a first input pin that is connected to the NQ' output of the scan cell, and a second input pin. An electrical interconnection is formed between the scan enable input of the scan cell and the second input pin of both the first logic gate and the second logic gate. A scan output (SO) pin is then connected to the Q' output that is coupled to the first input pin of the first logic gate.

In another embodiment, a scan flop cell incorporating a scan cell having inputs that include a data input (DI) pin, a scan input (SI) pin, a scan enable (SE) input, and a clock input is disclosed. The scan cell also includes a Q' output pin and an NQ' output pin. The scan flop cell includes a first AND gate having a Q output pin, and having a first input pin that is connected to the Q' output pin of the scan cell. The first AND gate also has a second input pin. The scan flop cell further includes a second AND gate that has an NQ output pin. The second AND gate has a second input pin and a first input pin that is connected to the NQ' output pin of the scan cell. An electrical interconnection is coupled between the scan enable (SE) input pin of the scan cell and the second input pin of both the first AND gate and the second AND gate. A scan output (SO) pin is coupled to the Q' output pin that is also connected to the first input pin of the first AND gate.

In still another embodiment, a method for making a scan flop cell is disclosed. The scan flop cell incorporates a scan cell having inputs that include a data input (DI) pin, a scan input (SI) pin, a scan enable (SE) input, and a clock input, the scan cell also includes a Q' output pin and an NQ' output pin. The method includes connecting a first input pin of a first logic gate to a Q' output pin of the scan cell. The first logic gate also has a second input pin and a Q output pin. The method also includes connecting a first input pin of a second logic gate to an NQ' output pin of the scan cell. The second logic gate also has a second input pin and an NQ output pin. Then, the method includes interconnecting an electrical connection between the scan enable (SE) input pin of the scan cell and the second input pin of both the first logic gate and the second logic gate. A scan output (SO) pin is then connected to the Q' output pin that is coupled to the first input pin of the first logic gate.

The inventive scan flop cell designs are generally integrated into IC designs in the form of scan chains, wherein the scan output (SO) of one scan flop cell leads to the scan input (SI) of a next cell. This inventive design therefore keeps both the Q output and the NQ output completely quite during scan mode testing, which prevents unnecessarily switching logic that is not in the scan chain. This therefore provides a substantial reduction in power consumption and heat dissipation during scan mode shifting. An additional advantage is that because less power is consumed and less heat is dissipated, it is now possible to perform scan mode testing at the speed the IC design is configured to operate during its functional mode. Testing the IC near its true functional speed also enables engineers the ability to detect faults that would not be detected if testing was performed at the substantially lower conventional scan mode testing frequency levels. Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 5 illustrates a truth table that describes the functionality of the scan flop cell of FIG. 3 in accordance with one embodiment of the present invention.

FIG. 6 is a symbol representation of the scan flop in accordance with one embodiment of the present invention.

FIG. 7 illustrates a single exemplary scan chain having a scan input SI pin, a scan output (SO) pin, a system clock (CP), and a scan enable (SE) pin in accordance with one embodiment of the present invention.

DETAILED DESCRIPTION OF THE PREFERRED EMBODIMENTS

An invention is described for a new and improved scan flop that maintains the simplicity of standard scan flop cells while eliminating unnecessary switching of logic that is outside of the scan chain. The scan flop of the present invention therefore reduces power consumption and associated heat dissipation, which therefore enables "at speed" scan testing for even the fastest system mode frequencies. The low power at speed testing therefore allows testing of critical timing parameters, which would not otherwise be discovered at reduced frequency level testing. It will be obvious, however, to one skilled in the art that the present invention may be practiced without some or all of these specific details. In other instances, well known process operations have not been described in detail in order not to unnecessarily obscure the present invention.

In one broad embodiment of the present invention, a low power scan flop cell design is disclosed. The scan flop cell embodies a scan cell that has inputs including a data input pin, a scan input (SI) pin, a scan enable (SE) input, and a clock input. The scan cell has outputs that include a Q' output and an NQ' output. The scan flop cell further includes a first logic gate having a Q output, a first input pin that is connected to the Q' output of the scan cell, and a second input pin. The scan flop also includes a second logic gate having an NQ output, a first input pin that is connected to the NQ' output of the scan cell, and a second input pin. An electrical interconnection is defined between the scan enable input of the scan cell and the second input pin of both the first logic gate and the second logic gate. A scan output (SO) pin is then connected to the Q' output that is coupled to the first input pin of the first logic gate. The following FIGS. 2–7 will now be described in order to clearly describe the embodiments of the present invention.

Figure 1A:
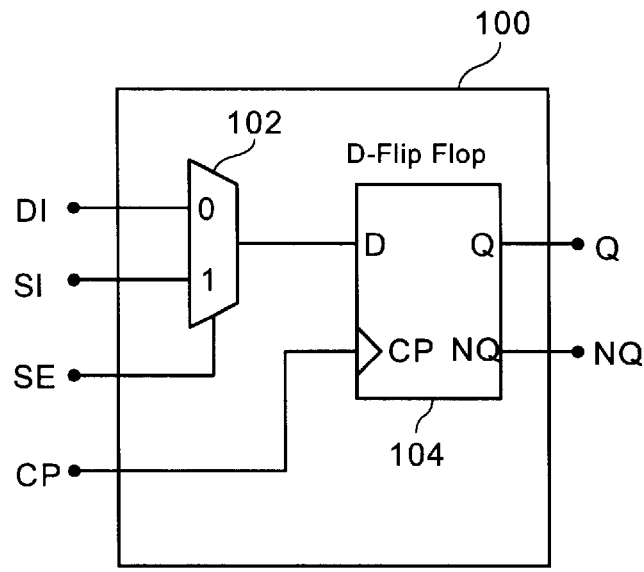
FIG. 1A illustrates a conventional scan flop having a multiplexer and a D flip flop.
Figure 1B:
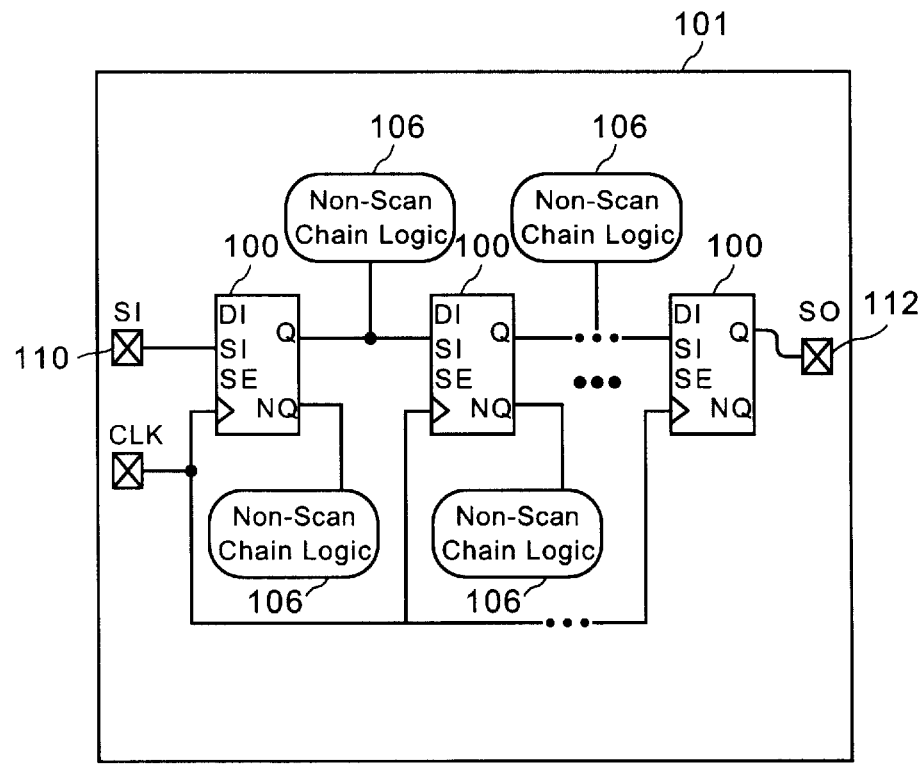
FIG. 1B illustrates a simplified semiconductor chip having a scan chain that is made up of a plurality of interconnected scan flops.
Figure 2:
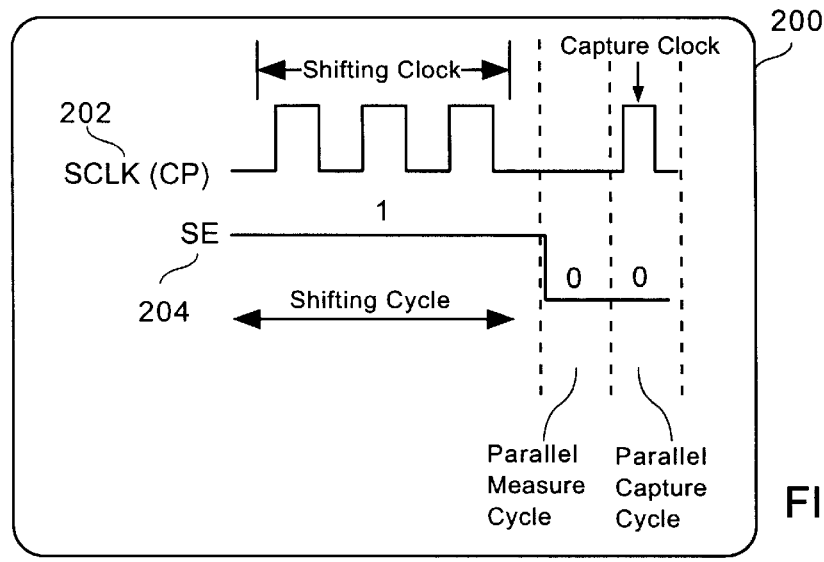
FIG. 2 is a timing diagram illustrating the different cycles that are exercised during the scan mode testing protocol in accordance with one embodiment of the present invention.

FIG. 2 is a timing diagram 200 illustrating the different cycles that are exercised during the scan mode testing protocol in accordance with one embodiment of the present invention. Scan mode testing is initiated when a scan enable (SE) signal 204 is provided with a logical one. At that time, the system clock (CP) signal 202 will shift once for every scan flop in the scan chains of a particular design. Also shown are the cycles for performing a parallel measure cycle and a parallel capture cycle, which are non-switching cycles. During these cycles, the scan enable (SE) signal 204 is set to a logical zero. As mentioned above, the parallel measure and the parallel capture testing cycles are run in order to test miscellaneous logic that is outside of the scan chains.

Figure 3:
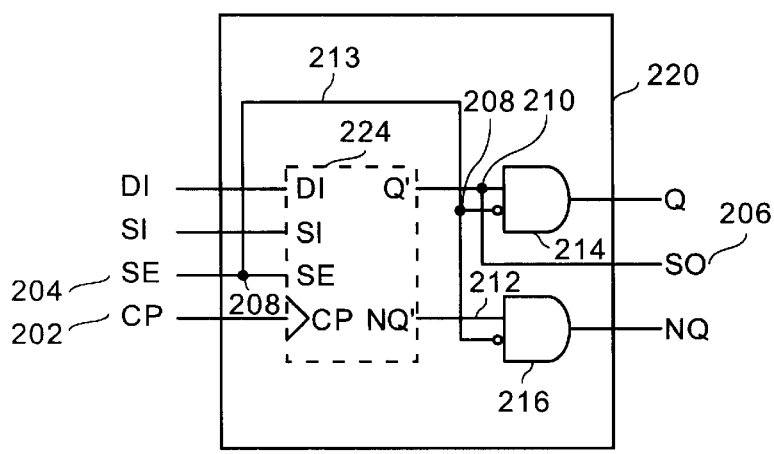
FIG. 3 illustrates a low power scan flop cell in accordance with one embodiment of the present invention.
Figure 4:
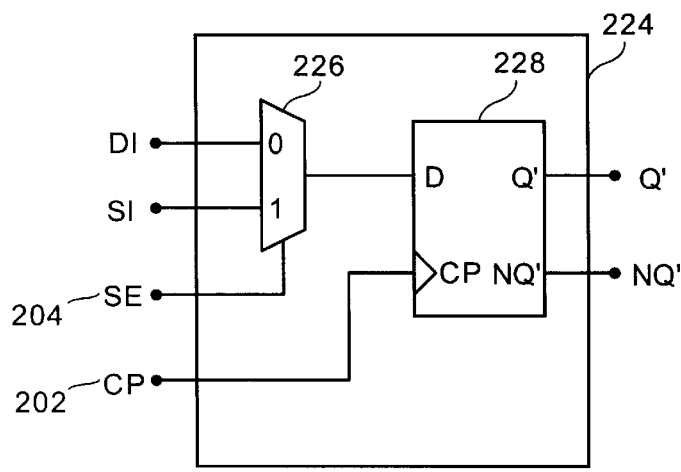
FIG. 4 is a more detailed illustration of the scan cell of FIG. 3 having a multiplexer and a D flip-flop.

FIG. 3 illustrates a low power scan flop cell 220 in accordance with one embodiment of the present invention. As shown, the scan flop cell 220 includes a scan cell 224 having input pins DI, SI, SE 204, CP 202 and outputs Q' and NQ'. FIG. 4 is a more detailed illustration of the scan cell 224, having a multiplexer 226 and a D flip-flop 228. The SE 204 signal is configured to control the multiplexer 226, and the CP 202 triggers the D flip-flop 228.

In this embodiment, the scan flop 220 includes a pair of logic gates that are configured to isolate the scan chain from combinational logic that is outside of the scan chain. The pair of logic gates preferably include an AND gate 214 and an AND gate 216. Of course, other suitable logic gates may also be used so long as the logic response provides the desired isolation and maintains the functionality of the scan flop cell 220. The AND gate 214 has a first input that is connected to the Q' output of the scan cell 224, and the AND gate 216 has a first input that is connected to the NQ' output of the scan cell 224. Once these connections are established, the scan enable (SE) signal 204 is coupled to a node 208 that is connected via a connection 213 to a second input of the AND gate 214 and the second input of the AND gate 216. At a node 210, which is defined between the Q' output and the first input of the AND gate 214, a scan output (SO) pin 206 is defined. More specifically, the SO pin 206 is the pin that will be connected to a next scan flop cell 220 of a scan chain, as will be illustrated below with reference to FIG. 7.

FIG. 5 illustrates a truth table that describes the functionality of the scan flop cell 220 in accordance with one embodiment of the present invention. In the first column, the scan enable (SE) signal 204 is show exhibiting a logical one and a logical zero. The second and third columns show how the Q output and the NQ output remain quite during the time when scan shifting is being performed and SE is set to the logical one. When the scan flop cell 220 is in scan capture, scan parallel measure or the functional mode (i.e., system mode), SE is set to a logical zero. When SE is set to the logical zero, the Q output receives the Q' output and the NQ output receives the NQ' output from the scan cell 224.

Accordingly, the functionality of the scan flop cell 220 of the present invention will not be altered during the time it operates in either the scan capture, scan parallel measure or the functional mode. However, when the scan flop is operating in the scan mode, the Q output and the NQ output will not cause combinational logic outside of the scan chain to toggle (thereby providing excellent power savings and reduced heat dissipation during testing).

FIG. 6 is a symbol representation of the scan flop 220 in accordance with one embodiment of the present invention. In this simplified representation, the system data input DI, scan data input SI, scan enable SE 204, and clock (CP) 202 define the inputs. In addition to the standard Q output and NQ output, a scan out (SO) 206 pin is provided. Therefore, the scan data can be shifted in through the input pin SI and clocked out through the scan output (SO) pin 206.

FIG. 7 illustrates a single exemplary scan chain having a scan input SI pin, a scan output (SO) pin 206, a system clock (CP) 202, and a scan enable (SE) 204 pin in accordance with one embodiment of the present invention. In this example, four exemplary scan flop cells 220 define the scan chain. Each of the scan flop cells 220 has a scan output (SO) pin that is configured to be electrically connected to the scan input (SI) of the next scan flop cell 220. Each of the Q outputs and the NQ outputs of the respective scan flop cells 220 are shown connected to combinational logic 230 of the integrated circuit design that incorporates the exemplary scan chain. Although the combination logic 230 is illustrated as distinct logic clouds, those skilled in the are will readily appreciate that the combinational logic 230 is actually distributed throughout the entire integrated circuit chip in order to complete the desired functional IC implementation. This combinational logic 230 also typically includes non-scan sequential cells such as latches.

The important aspect here is that when shifting operations are performed during the loading of the automatically generated ATPG vector, none of the combinational logic 230 is shifted. This is a substantial advance in the art because this allows scan mode operation at the frequency that the IC device is intended to operate in system mode. Because the combinational logic 230 is not being toggled, less power consumption occurs in test mode and less heat is dissipated. As a result of this advance, it will also be possible to scan test the IC's timing characteristics at the system mode frequency.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A low power scan flop cell, comprising:
a scan cell having inputs including a data input pin, a scan input (SI) pin, a scan enable input, and a clock input, and outputs including a Q' output and an NQ' output;
a first logic gate having a Q output, and having a first input pin that is connected to the Q' output of the scan cell, and a second input pin;
a second logic gate having an NQ output, and having a first input pin that is connected to the NQ' output of the scan cell, and a second input pin;
an electrical interconnection being formed between the scan enable input of the scan cell and the second input pin of both the first logic gate and the second logic gate; and
a scan output (SO) pin being connected to the Q' output that is coupled to the first input pin of the first logic gate.

2. A low power scan flop cell as recited in claim 1, wherein the first logic gate is a first AND gate, and the second logic gate is a second AND gate.

3. A low power scan flop cell as recited in claim 2, further comprising:
a scan chain including a plurality of low power scan flop cells, such that a first low power scan flop cell of the scan chain is configured to receive a test data at the scan input (SI) pin and a last low power scan flop cell of the scan chain is configured to output the test data at the scan output (SO) pin.

4. A low power scan flop cell as recited in claim 3, wherein each of the plurality of low power scan flop cells of the scan chain are interconnected between the first low power scan flop cell and the last low power scan flop cell.

5. A low power scan flop cell as recited in claim 4, wherein when each of the plurality of low power scan flop cells are interconnected, the scan output pin of the plurality of low power scan flop cells is coupled to the scan input (SI) pin of a next one of the plurality of low power scan flop cells.

6. A low power scan flop cell as recited in claim 3, wherein the first AND gate and the second AND gate isolate the scan chain from combinational logic when the scan enable input is supplied with a logical one.

7. A low power scan flop cell as recited in claim 1, wherein the scan enable input is supplied with a logical zero when the low power scan flop cell operates in one of a parallel scan capture mode, a parallel measure mode, and a functional mode.

8. A low power scan flop cell as recited in claim 1, wherein the scan cell comprises:
   a muliplexer circuit; and
   a D flip-flop circuit having a D input that is configured to receive an output of the multiplexer circuit.

9. A low power scan flop cell as recited in claim 3, wherein one or more of the scan chain is integrated into a semiconductor chip for enabling fault coverage testing.

10. A scan flop cell incorporating a scan cell having inputs that include a data input (DI) pin, a scan input (SI) pin, a scan enable (SE) input pin, and a clock input, the scan cell also includes a Q' output pin and an NQ' output pin, the scan flop cell comprises:
    a first AND gate having a Q output pin, and having a first input pin that is connected to the Q' output pin of the scan cell, and a second input pin;
    a second AND gate having an NQ output pin, and having a first input pin that is connected to the NQ' output pin of the scan cell, and a second input pin;
    an electrical interconnection coupled between the scan enable (SE) input pin of the scan cell and the second input pin of both the first AND gate and the second AND gate; and
    a scan output (SO) pin coupled to the Q' output pin that is also connected to the first input pin of the first AND gate.

11. A scan flop cell as recited in claim 10, further comprising:
    a scan chain including a plurality of scan flop cells, such that a first scan flop cell of the scan chain is configured to receive a test vector at the scan input (SI) pin and a last scan flop cell of the scan chain is configured to output the test vector at the scan output (SO) pin.

12. A scan flop cell as recited in claim 11, wherein each of the plurality of scan flop cells of the scan chain are interconnected between the first scan flop cell and the last scan flop cell.

13. A scan flop cell as recited in claim 12, wherein when each of the plurality of scan flop cells are interconnected, the scan output (SO) pin of the plurality of scan flop cells is coupled to the scan input (SI) pin of a next one of the plurality of scan flop cells.

14. A scan flop cell as recited in claim 11, wherein the first AND gate and the second AND gate isolate the scan chain from logic that is not in the scan chain when the scan enable (SE) input pin holds a logical one.

15. A scan flop cell as recited in claim 10, wherein the scan enable (SE) input pin holds a logical zero when the scan flop cell operates in one of a parallel scan capture mode, a parallel measure mode, and a system mode.

16. A scan flop cell as recited in claim 10, wherein the scan cell further comprises:
    a muliplexer circuit; and
    a D flip-flop circuit having a D input that is configured to receive an output of the multiplexer circuit.

17. A scan flop cell as recited in claim 11, wherein one or more of the scan chain is integrated into a semiconductor chip for enabling fault coverage information.

18. A method for making a scan flop cell incorporating a scan cell having inputs that include a data input (DI) pin, a scan input (SI) pin, a scan enable (SE) input pin, and a clock input, the scan cell also includes a Q' output pin and an NQ' output pin, the method comprises:
    connecting a first input pin of a first logic gate to a Q' output pin of the scan cell, the first logic gate further including a second input pin and a Q output pin;
    connecting a first input pin of a second logic gate to an NQ' output pin of the scan cell, the second logic gate further including a second input pin and an NQ output pin;
    interconnecting an electrical connection between the scan enable (SE) input pin of the scan cell and the second input pin of both the first logic gate and the second logic gate;
    connecting a scan output (SO) pin to the Q' output pin that is connected to the first input pin of the first logic gate.

19. A method for making a scan flop cell as recited in claim 18, further comprising:
    building a scan chain including a plurality of scan flop cells, such that a first scan flop cell of the scan chain is configured to receive a test vector at the scan input (SI) pin and a last scan flop cell of the scan chain is configured to output the test vector at the scan output (SO) pin.

20. A method for making a scan flop cell as recited in claim 19, wherein the building further comprises:
    interconnecting the plurality of scan flop cells of the scan chain between the first scan flop cell and the last scan flop cell.

21. A method for making a scan flop cell as recited in claim 20, wherein when each of the plurality of scan flop cells are interconnected, the scan output (SO) pin of the plurality of scan flop cells is coupled to the scan input (SI) pin of a next one of the plurality of scan flop cells.

22. A method for making a scan flop cell as recited in claim 18, wherein the first logic gate and the second logic of each of the plurality of scan flop cells isolate the scan chain from non-scan chain logic when the scan enable (SE) input pin is provided with a logical one.

23. A method for making a scan flop cell as recited in claim 22, wherein when the scan chain is isolated from the non-scan chain logic, the non-scan chain logic is not switched.

24. A method for making a scan flop cell as recited in claim 23, wherein when the non-scan chain logic is not switched, test mode power consumption and dissipation is reduced.

25. A method for making a scan flop cell as recited in claim 19, further comprising:
    integrating one or more of the scan chain into an integrated circuit chip to enable fault coverage testing.

* * * * *